United States Patent
Yi et al.

(10) Patent No.: US 7,541,623 B2
(45) Date of Patent: Jun. 2, 2009

(54) P-N HETEROJUNCTION STRUCTURE OF ZINC OXIDE-BASED NANOROD AND SEMICONDUCTOR THIN FILM, PREPARATION THEREOF, AND NANO-DEVICE COMPRISING SAME

(75) Inventors: Gyu-Chul Yi, Pohang-si (KR); Won-Il Park, Pohang-si (KR)

(73) Assignee: Postech Foundation, Pohang-si, Kyungsangbuk-do (KR)

( * ) Notice: Subject to any disclaimer, the term of this patent is extended or adjusted under 35 U.S.C. 154(b) by 466 days.

(21) Appl. No.: 10/562,006

(22) PCT Filed: Jun. 25, 2004

(86) PCT No.: PCT/KR2004/001546
§ 371 (c)(1), (2), (4) Date: Dec. 23, 2005

(87) PCT Pub. No.: WO2004/114422
PCT Pub. Date: Dec. 29, 2004

(65) Prior Publication Data
US 2006/0189018 A1    Aug. 24, 2006

(30) Foreign Application Priority Data
Jun. 26, 2003    (KR) .................. 10-2003-0041813

(51) Int. Cl.
*H01L 21/00* (2006.01)
(52) U.S. Cl. ............... 257/98; 257/79; 257/183
(58) Field of Classification Search ............ 257/98, 257/79, 183
See application file for complete search history.

(56) References Cited

U.S. PATENT DOCUMENTS

| 6,882,051 | B2 * | 4/2005 | Majumdar et al. .......... 257/746 |
| 6,996,147 | B2 * | 2/2006 | Majumdar et al. ....... 372/43.01 |
| 7,078,683 | B2 * | 7/2006 | Joyce ....................... 250/288 |
| 7,102,173 | B2 * | 9/2006 | Yi et al. ..................... 257/79 |
| 7,122,827 | B2 * | 10/2006 | Alizadeh et al. ............. 257/17 |
| 7,202,173 | B2 * | 4/2007 | Hantschel et al. .......... 438/694 |
| 7,211,143 | B2 * | 5/2007 | Yang et al. .................. 117/84 |
| 7,265,037 | B2 * | 9/2007 | Yang et al. ................. 438/497 |

(Continued)

FOREIGN PATENT DOCUMENTS

EP    1 258 928 A1    11/2002

(Continued)

OTHER PUBLICATIONS

S. Muthukumar et al., "Selective MOCVD Growth of ZnO Nanotips", IEEE Transactions on Nanotechnology, vol. 2, No. 1, Mar. 2003.

(Continued)

*Primary Examiner*—Laura M Menz
(74) *Attorney, Agent, or Firm*—Sughrue Mion, PLLC

(57) ABSTRACT

A heterojunction structure composed of a p-type semiconductor thin film and n-type ZnO-based nanorods epitaxially grown thereon exhibits high luminescence efficiency property due to facilitated tunneling of electrons through the nano-sized junction and the use of ZnO having high exciton energy as a light emitting material, and thus it can be advantageously used in nano-devices such as LED, field effect transistor, photodetector, sensor, etc.

9 Claims, 4 Drawing Sheets

U.S. PATENT DOCUMENTS

| | | | |
|---|---|---|---|
| 7,393,410 B2 * | 7/2008 | Lee et al. | 117/84 |
| 2002/0172820 A1 * | 11/2002 | Majumdar et al. | 428/357 |
| 2002/0175408 A1 * | 11/2002 | Majumdar et al. | 257/734 |
| 2004/0127130 A1 * | 7/2004 | Yi et al. | 442/376 |
| 2004/0175844 A1 * | 9/2004 | Yang et al. | 438/2 |
| 2004/0252737 A1 * | 12/2004 | Yi et al. | 372/43 |
| 2005/0082543 A1 * | 4/2005 | Alizadeh et al. | 257/79 |
| 2005/0161662 A1 * | 7/2005 | Majumdar et al. | 257/18 |
| 2005/0179052 A1 * | 8/2005 | Yi et al. | 257/183 |
| 2005/0199886 A1 * | 9/2005 | Yi et al. | 257/79 |
| 2006/0097149 A1 * | 5/2006 | Joyce | 250/288 |
| 2006/0131679 A1 * | 6/2006 | Hantschel et al. | 257/415 |
| 2006/0134392 A1 * | 6/2006 | Hantschel et al. | 428/210 |
| 2006/0134883 A1 * | 6/2006 | Hantschel et al. | 438/458 |
| 2006/0189018 A1 * | 8/2006 | Yi et al. | 438/47 |
| 2006/0207647 A1 * | 9/2006 | Tsakalakos et al. | 136/256 |
| 2006/0292839 A1 * | 12/2006 | Yi et al. | 438/570 |
| 2007/0045660 A1 * | 3/2007 | Yi et al. | 257/183 |
| 2007/0096075 A1 * | 5/2007 | Li et al. | 257/10 |
| 2007/0158661 A1 * | 7/2007 | Lu et al. | 257/79 |
| 2007/0164270 A1 * | 7/2007 | Majumdar et al. | 257/14 |
| 2007/0184975 A1 * | 8/2007 | Yi et al. | 502/343 |
| 2007/0284573 A1 * | 12/2007 | Tseng et al. | 257/43 |
| 2008/0092938 A1 * | 4/2008 | Majumdar et al. | 136/200 |
| 2008/0107876 A1 * | 5/2008 | Yi et al. | 428/201 |
| 2008/0108122 A1 * | 5/2008 | Paul et al. | 435/183 |
| 2008/0110486 A1 * | 5/2008 | Tsakalakos et al. | 136/244 |
| 2008/0135089 A1 * | 6/2008 | Tsakalakos et al. | 136/248 |
| 2008/0157235 A1 * | 7/2008 | Rogers et al. | 257/415 |
| 2008/0315229 A1 * | 12/2008 | Yi et al. | 257/98 |

FOREIGN PATENT DOCUMENTS

| | | |
|---|---|---|
| KR | 2001-70678 A | 7/2001 |
| WO | WO 2004114422 A1 * | 12/2004 |

OTHER PUBLICATIONS

S. Muthukumar et al., "Selective MOCVD Growth of ZnO Nanotips", *IEEE Transactions on nanotechnology*, vol. 2, No. 1, Mar. 2003, pp. 50-54.

J. Zhong et al., "ZnO nanotips grown on Si substrates by Metal-Organic Chemical-Vapor Deposition", *Journal of Electronic Materials*, vol. 33, No. 6. Jun. 1, 2004, pp. 654-657.

* cited by examiner

P-N HETEROJUNCTION STRUCTURE OF ZINC OXIDE-BASED NANOROD AND SEMICONDUCTOR THIN FILM, PREPARATION THEREOF, AND NANO-DEVICE COMPRISING SAME

FIELD OF THE INVENTION

The present invention relates to a novel heterojunction structure comprising a p-type semiconductor thin film and an n-type ZnO-based nanorod epitaxially grown thereon, which provides a light emitting device having improved luminescence properties.

BACKGROUND OF THE INVENTION

The Gallium nitride (GaN)-based blue light emitting diode (LED) developed by Nichia Chemical Co., Ltd. in 1993 uses a GaN p-n thin film junction to provide blue and green LED devices, and in 1997, a short wavelength (404 nm) blue LED having a life span of about 10,000 hours at room temperature has been developed using a nitride semiconductor.

Recently, an n-type oxide semiconductor, zinc oxide (ZnO), has attracted attention as an another efficient light emitting ($\lambda$=380 nm) material at room temperature due to its interesting features: (1) a direct transition band structure, (2) a low power threshold for optical pumping at room temperature and (3) a large exciton binding energy (60 meV).

However, the development of a p-n heterojunction structure of zinc oxide has been hampered due to the difficulty of fabricating p-type ZnO.

SUMMARY OF THE INVENTION

Accordingly, it is a primary object of the present invention to provide a novel heterojunction structure formed by way of using n-ZnO in the form of a nanorod and a p-type semiconductor material other than p-ZnO in the form of a thin film, which can be advantageously used for nano-devices such as LED, field effect transistor, photodetector, sensor, etc.

It is another object of the present invention to provide a method for preparing such a structure.

It is a further object of the present invention to provide a nano-device or an array thereof comprising such a structure.

In accordance with one aspect of the present invention, there is provided a heterojunction structure comprising a p-type semiconductor thin film and an n-type ZnO-based nanorod epitaxially grown thereon.

In accordance with another aspect of the present invention, there is provided a method for preparing said heterojunction structure, which comprises bringing the vapors of a Zn-containing metal organic compound and an $O_2$-containing compound as reactants separately into contact with a p-type semiconductor thin film at a temperature in the range of 400 to 700° C. under a pressure in the range of 0.1 to 10 torr to form a ZnO nanorod on the surface of the semiconductor film.

In accordance with a still another aspect of the present invention, there is provided a nano-device or an array thereof comprising said heterojunction structure.

BRIEF DESCRIPTION OF THE DRAWINGS

The above and other objects and features of the present invention will become apparent from the following description of the invention, when taken in conjunction with the accompanying drawings, which respectively show.

DETAILED DESCRIPTION OF THE INVENTION

Figure 1:
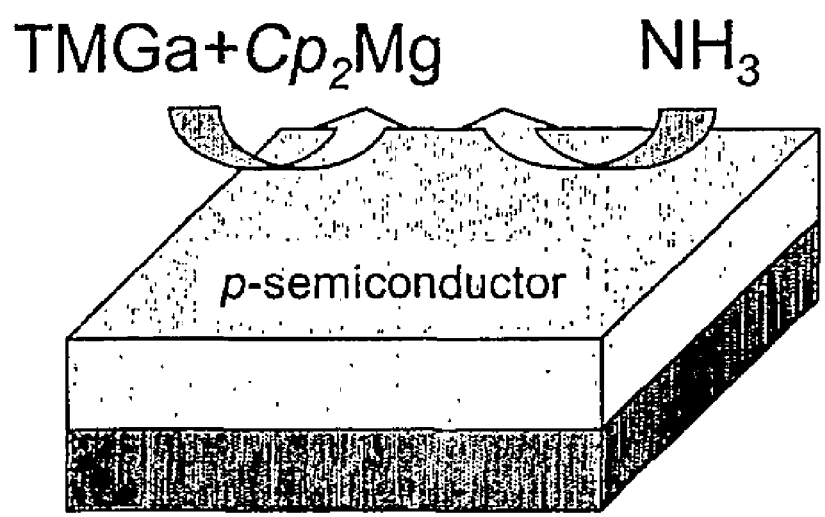
FIG. 1: a schematic diagram of the process for preparing a p-n heterojunction structure in accordance with Example 1 of the present invention.
Figure 1:
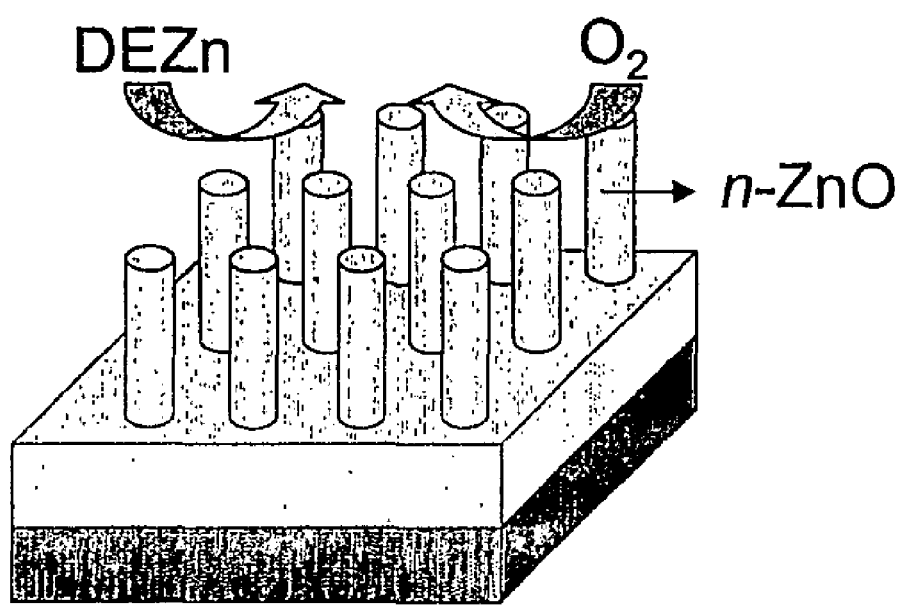

The inventive heterojunction structure characteristically comprises a p-type semiconductor thin film and an n-type ZnO-based nanorod epitaxially grown thereon.

Also, a nano-device comprising said heterojunction structure can be fabricated by forming electrodes using a thermal or electron beam evaporation technique on the opposing surfaces of the p-type semiconductor thin film and n-type nanorods of the heterojunction structure.

In the inventive heterojunction structure, the p-type semiconductor thin film may be in the form of a single crystal, or a thin film formed on a substrate using a conventional metal organic chemical vapor deposition (MOCVD) method which comprises heating a substrate and bringing the vapors of appropriate precursors into contact with the surface of the substrate.

The p-type semiconductor thin film of the inventive structure may have a thickness ranging from 50 nm to 200 μm.

Suitable for use as the p-type semiconductor for a thin film is a material having a band-gap of 1.5 to 4.5 eV, and representative examples thereof include a III-VB group semiconductor such as GaN, AlN, GaP, GaAs, etc.; a II-VIB group semiconductor such as ZnSe, CdSe, CdS, ZnS, etc.; and a semiconductor such as $SrCu_2O_2$, SiC, Si, etc.

Further, the ZnO-based nanorod grown on the p-type semiconductor thin film may be a ZnO nanorod, or a ZnO nanorod doped or coated with a heteromaterial. Exemplary heteromaterial dopants include Mg, Mn, Cd, Se, etc.; and doped heteromaterials, $Zn_{1-x}Mg_xO$ (0<x<1), $Zn_{1-x}Mn_xO$ (0<x<1), $Zn_{1-x}Cd_xO$ (0<x<1), $Zn_{1-x}Se_xO$ (0<x<1) and the like.

The inventive heterojunction structure can be prepared by epitaxially growing ZnO-based nanorods onto a p-type semiconductor thin film using a metal organic chemical vapor deposition (MOCVD) method, which comprises brining the vapors of a Zn-containing metal organic compound and an $O_2$-containing compound as reactants separately into contact with a p-type semiconductor thin film at 400 to 700° C. under a pressure in the range of 0.1 to 10 torr.

If necessary, a ZnO nanorod formed on a p-type semiconductor thin film may be doped or coated with a heteromaterial by introducing the vapor of a compound containing a heteromaterial such as Mg, Mn, Cd, Se, etc., at the time of introducing the reactant vapors or after the formation of the ZnO nanorod, to form a heteromaterial-doped or coated ZnO nanorod.

The diameter, length and density of ZnO-based nanorods formed on a p-type semiconductor thin film can be varied depending on the reaction conditions such as the amount of gaseous reactants introduced into a reaction chamber, deposition temperature and pressure, etc., during their growth.

The nanorod on a thin film of the inventive structure may have a diameter in the range of 5 to 100 nm and a length in the range of 5 nm to 100 μm.

Exemplary Zn-containing metal-organic compounds that can be used as precursors for zinc oxide in the present invention include dimethylzinc [$Zn(CH_3)_2$], diethylzinc [$Zn(C_2H_5)_2$], zinc acetate [$Zn(OOCCH_3)_2 \cdot H_2O$], zinc acetate anhydride [$Zn(OOCCH_3)_2$], zinc acetyl acetonate [$Zn(C_5H_7O_2)_2$], etc; $O_2$-containing compound, $O_2$, $O_3$, $NO_2$, $H_2O$ (vapor), $CO_2$, $C_4H_8O$, etc.

Further, exemplary Mg-containing metal organic compounds that can be used as precursors for nanorod doping or coating in the present invention include bis(cyclopentadienyl) magnesium [$(C_5H_5)_2Mg$], bis(methylcyclopentadienyl) magnesium [$(CH_3C_5H_4)_2Mg$], bis(ethylcyclopentadienyl) magnesium [$(C_2H_5C_5H_4)_2Mg$], bis(pentamethylcyclopentadienyl) magnesium [$\{(CH_3)_5C_5\}_2Mg$], magnesium acetate [$Mg(OOCCH_3)_2 \cdot H_2O$], magnesium acetate anhydride [$Mg(OOCCH_3)_2$], magnesium acetyl acetonate [$Mg(C_5H_7O_2)_2 \cdot H_2O$], etc; Mn-containing metal organic compound, bis(cyclopentadienyl) manganese [$(C_5H_5)_2Mn$], etc; Cd-containing metal organic compound, diethylcadmium [$(C_2H_5)_2Cd$], etc; Se-containing metal organic compound, diethylselenium [$(C_2H_5)_2Se$], etc.

Figure 2:
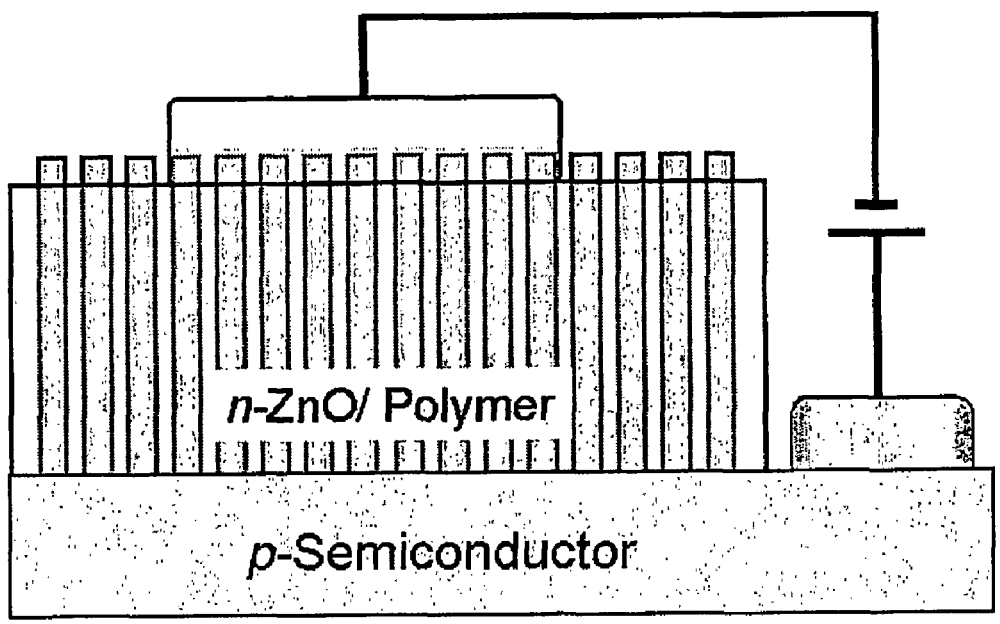
FIG. 2: a schematic diagram of the light emitting diode device comprising a p-n heterojunction structure in accordance with the present invention.

The inventive heterojunction structure composed of a p-type semiconductor thin film and n-type ZnO-based nanorods vertically grown thereon can be used for an LED device as shown in FIG. 2.

The heterojunction structure according to the present invention uses ZnO having high exciton binding energy which can be advantageously used for LED having improved emission characteristics resulting from the recombination of excitons at room temperature.

Further, the inventive heterojunction structure may be a p-n nano junction which facilitates electron tunneling to increase the light emission area and comprises a nanorod having a high aspect ratio, and thus it can be used for light emitting devices having high luminescence efficiency at room temperature or higher.

As ZnO-based nanorods are formed epitaxially on a thin film in the inventive heterojunction structure, an array of light emitting device comprising such a structure can be easily assembled to fabricate various nanosystems.

The following Examples are intended to illustrate the present invention more specifically, without limiting the scope of the invention.

EXAMPLE 1

The Growth of ZnO Nanorods on a P-Type GaN Thin Film

ZnO-based p-n heterojunction structure was prepared by the process as shown in FIG. 1 as follows.

An Mg-doped GaN thin film was deposited on an $Al_2O_3$ substrate using a conventional MOCVD technique and annealed, to obtain a p-type GaN thin film having a thickness of 2 μm. The metal organic precursors used were trimethylgallium (TMGa) and bis(cyclopentadienyl) magnesium (($C_5H_5)_2Mg$); and the nitrogen precursor, $NH_3$.

Then, n-type ZnO nanorods were vertically grown on the p-type GaN thin film thus obtained, by injecting gaseous $Zn(C_2H_5)_2$ and $O_2$ at flow rates in the ranges of 1 to 10 sccm and 20 to 100 sccm, respectively, with an argon (Ar) carrier gas and reacting the vapors for about 1 hour, to obtain a p-n heterojunction structure comprising n-ZnO nanorods grown on the p-GaN thin film. The reactor pressure and temperature were maintained in the ranges of 0.1 to 10 torr and 400 to 700° C., respectively, during the ZnO nanorod growth.

Figure 3:
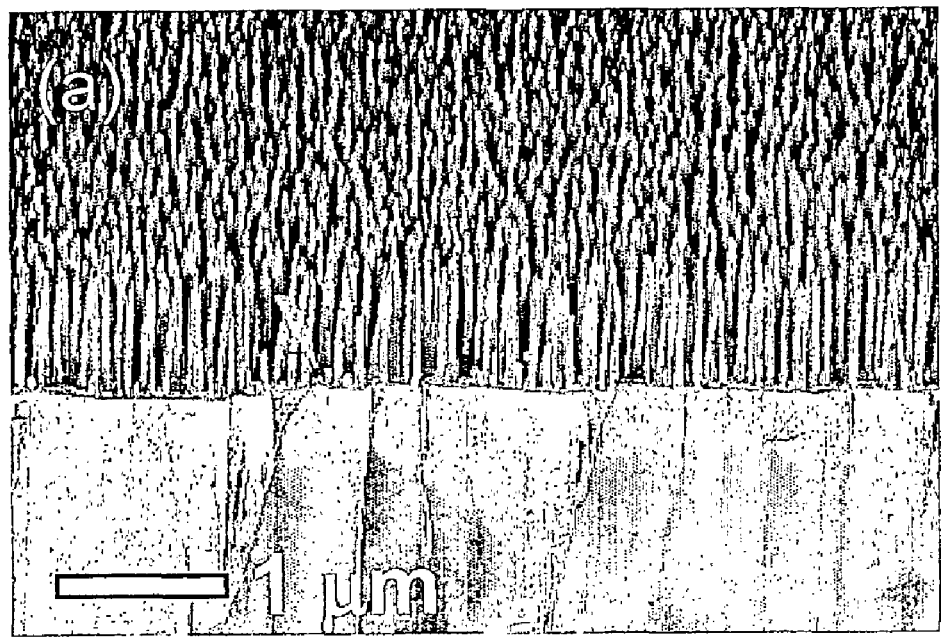
FIGS. 3(a) and 3(b): scanning electron microscope scans of the ZnO-based p-n heterojunction structures obtained in Examples 1 and 2 of the present invention, respectively.
Figure 3:
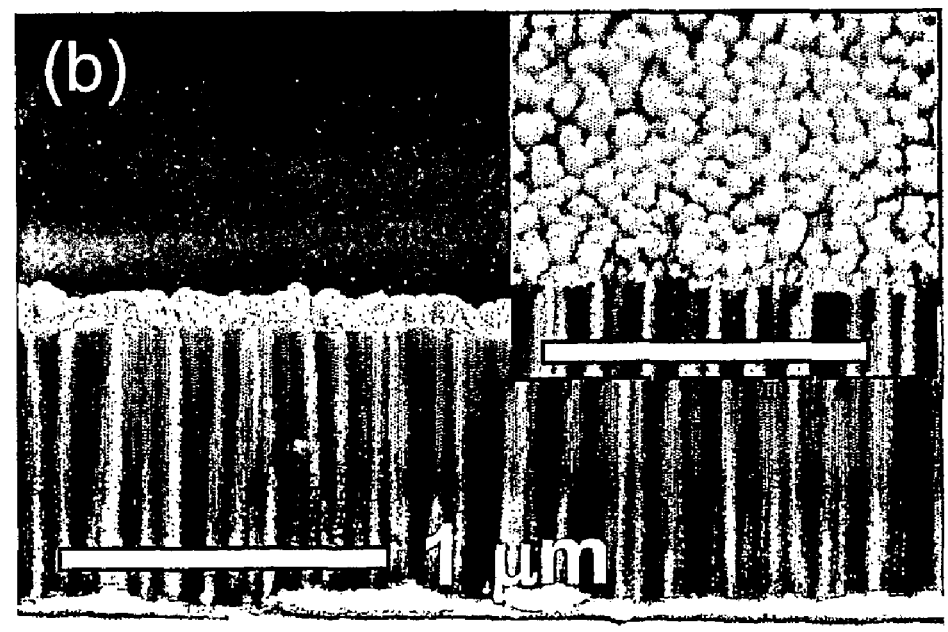

A scanning electron microscope (SEM) photograph of the p-n heterojunction structure thus obtained is shown in FIG. 3(*a*), which reveal ZnO nanorods having a 40 nm diameter and 1 μm length are uniformly and vertically grown on the surface of the GaN thin film. Further, an X-ray diffraction (XRD) study showed that the nanorods are epitaxially grown in the (0001) orientation on the GaN thin film substrate having the same orientation.

EXAMPLE 2

Fabrication of a Light Emitting Diode

A light emitting diode was fabricated using the heterojunction structure prepared in Example 1 as follows.

First, the free space around the ZnO nanorods grown on a GaN thin film was filled up by depositing an insulating material (e.g., photoresist, polyimide, etc.) thereon, and then, the tip portion of the nanorods was exposed by etching using a plasma. Subsequently, a Ti (10 nm)/Au (50 nm) top ohmic electrode was formed at the tip portion of the etched n-type nanorods; and a Pt (10 nm)/Au (50 nm) bottom electrode, on the p-type GaN thin film, by a thermal or electron beam evaporation technique. The applied accelerating voltage and emission current were in the ranges of 4 to 20 kV and 40 to 400 mA, respectively, during the electrodes deposition, which was conducted under a reactor pressure of around $10^{-5}$ mmHg, while keeping the substrate temperature at room temperature.

The cross-sectional morphology of the top electrode-formed ZnO nanorods was investigated by scanning electron microscopy (SEM) and the result is shown in FIG. 3(*b*).

Figure 4:
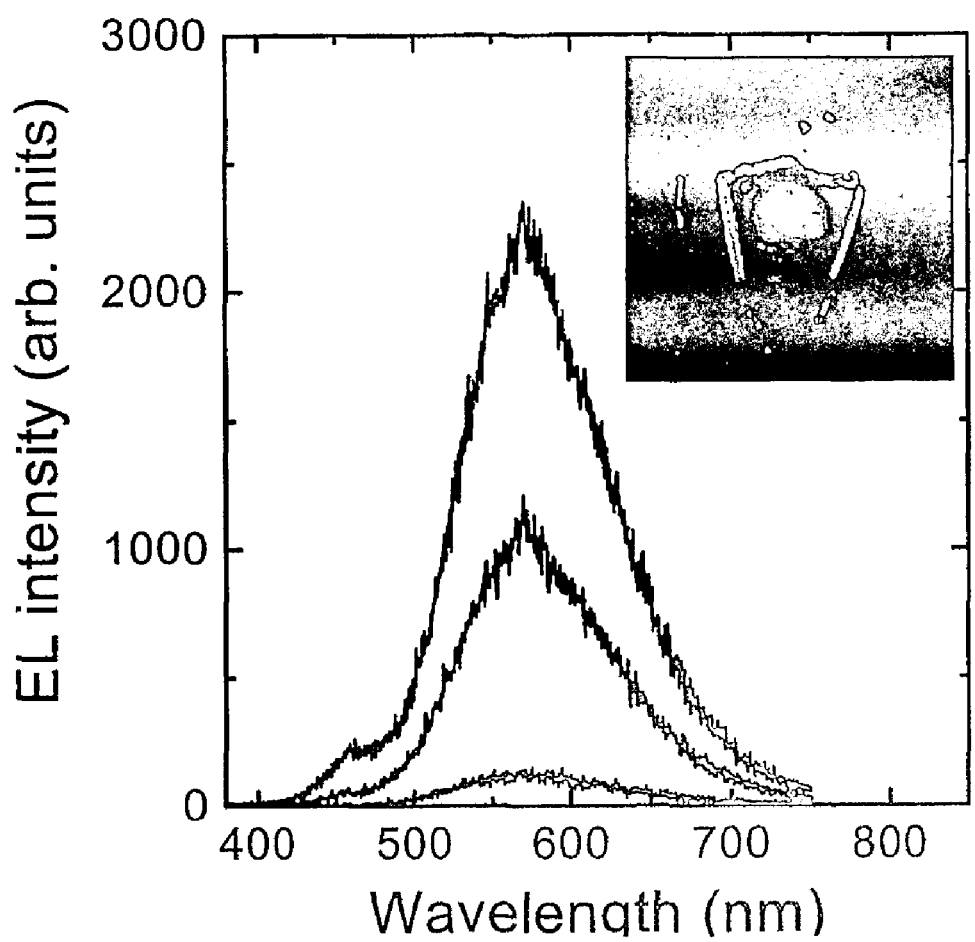
FIG. 4: the light emission spectrum of the LED obtained in Example 2 of the present invention, which comprises the heterojunction structure formed by epitaxially growing n-type ZnO nanorods on a p-type GaN thin film.

Also, a light emission spectrum of the LED thus obtained is shown in FIG. 4. The light emission was strong enough to be visually recognizable and its intensity did not decrease during a long period of repeated operation (several tens of cycles). Further, as shown in FIG. 4, the device has emission peaks at around 570 nm and 470 nm.

The above result suggests that the inventive heterojunction structure of a p-type semiconductor thin film having epitaxially grown n-type ZnO-based nanorods has excellent light emission characteristics.

While the embodiments of the subject invention have been described and illustrated, it is obvious that various changes and modifications can be made therein without departing from the spirit of the present invention which should be limited only by the scope of the appended claims.

What is claimed is:

1. A nano-device comprising a p-n hetrojunction structure of a p-type semiconductor thin film and an n-type ZnO-based nanorod epitaxially grown thereon, wherein free space around portions other than tip portions of the ZnO nanorod grown on the semiconductor thin film is filled with an insulating material.

2. The nano-device of claim 1, wherein the p-type semiconductor is made of a material having a band-gap energy ranging from 1.5 to 4.5 eV.

3. The nano-device of claim 2, wherein p-type semiconductor is made of a material selected from the group consisting of GaN, AlN, GaP, GaAs, ZnSe, CdSe, CdS, ZnS, $SrCu_2O_2$, and SiC.

4. The nano-device of claim 1, wherein the p-type semiconductor thin film has a thickness ranging from 50 nm to 200 μm.

5. The nono-device of claim 1, wherein the ZnO-based nanorod has a diameter in the range of 5 to 100 nm and a length in the range of 5 nm to 100 μm.

6. The nano-device of claim 1, wherein the ZnO-based nanorod is a ZnO nanorod or a heteromaterial-doped or coated ZnO-nanorod.

7. The nano-device of claim 6, wherein the heteromaterial is selected from the group consisting of Mg, Mn, Cd, Se and mixtures thereof.

8. The nano-device of claim 6, wherein the doped heteromaterial is selected from the group consisting of $Zn_{1-x}Mg_xO$ (0<x<1), $Zn_{1-x}Mn_xO$ (0<x<1), $Zn_{1-x}Cd_xO$ (0<x<1) and $Zn_{1-x}Se_xO$ (0<x<1).

9. A nano-system or an integrated circuit comprising the nano-device of claim 1.

* * * * *